TRANSISTOR AMPLIFICATION CIRCUITRY

Filed May 27, 1965

INVENTOR.
ADRIAN J. MOSES
BY Bruce C Lutz
ATTORNEY

United States Patent Office 3,456,204

Patented July 15, 1969

3,456,204

TRANSISTOR AMPLIFICATION CIRCUITRY

Adrian J. Moses, Rush City, Minn., assignor to Honeywell Inc., a corporation of Delaware Filed May 27, 1965, Ser. No. 459,270
Int. Cl. H03f 3/04
U.S. Cl. 330—21 7 Claims

ABSTRACT OF THE DISCLOSURE

A basic amplification circuit having a feedback network which may be modified to provide a variable gain amplifier, a lead network, and/or a high-pass filter.

This invention is concerned generally with electronic circuitry and more particularly with an amplifier circuit which can be used in several different embodiments. In one embodiment it is a variable gain amplifier while in a second embodiment it provides a lead network and in a third embodiment provides a high-pass filter.

The basic amplifier has a feedback circuit which may be modified in various ways. To provide the variable gain amplifier the attenuation of the feedback signal is varied so that in all cases a full amplitude output signal may be obtained. In the second embodiment capacitors are allowed to charge slowly between the feedback network and a reference potential so that increasing amounts of feedback signal are applied to the amplifier to provide a lead network effect. In the third embodiment a resistor is added between the input and the feedback terminal so that these capacitors used in the lead network can charge up fully and produce a high-pass filter which provides zero output after a given time whereas in the lead network some signal will always appear at the output terminals.

It is therefore an object of this invention to provide improved amplifier circuitry.

Figure 1:
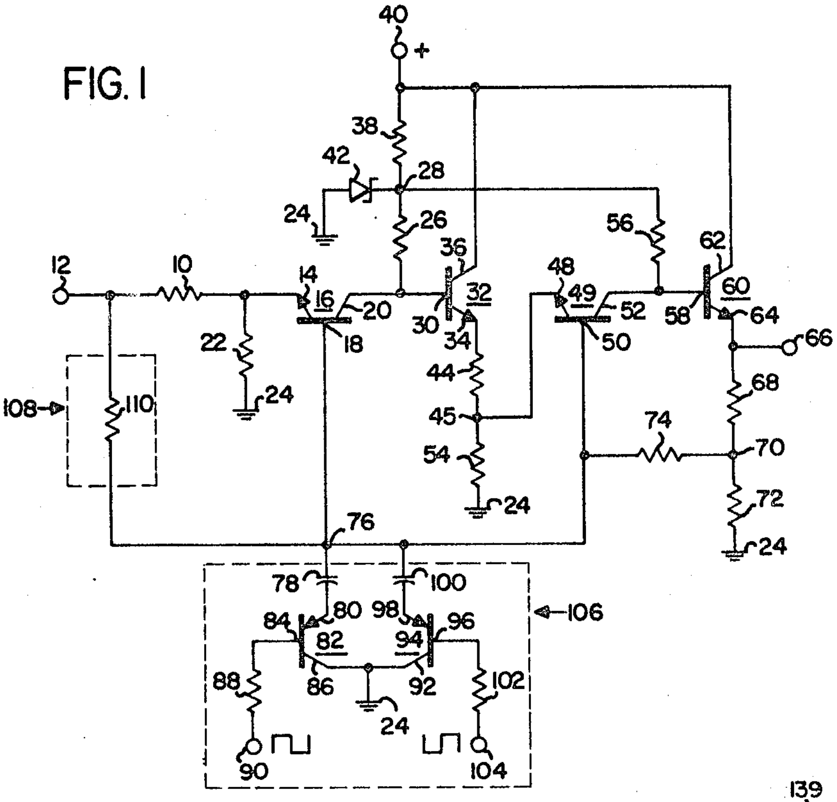
Figure 2:
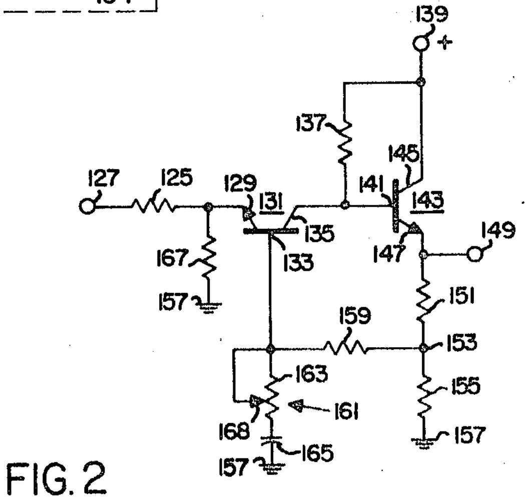

Other objects and advantages of this invention will be apparent from a reading of the specification and appended claims in conjunction with the figures wherein:

FIGURE 1 is a circuit diagram of the complete third embodiment or high-pass filter network; and FIGURE 2 is a circuit diagram of a variable gain amplifier.

In FIGURE 1 a resistor 10 is connected between an input 12 and an emitter 14 of an NPN transistor 16 having a base 18 and a collector 20. Throughout the specification the resistors will be referred to as resistors and the capacitors as capacitors but it is to be understood that each of these circuit components is to be designated in its alternative broader form of impedanee means. Further, while the transistors shown in the two figures are of a given polarity type, it is to be realized that these transistors may be of different polarity types with proper alteration of polarities applied and further that each of the transistors is included under the various terms variable impedance means, switching means, valve means, and amplifying means.

A resistor 22 is connected between emitter 14 and ground or reference potential 24. A resistor 26 is connected between a junction point 28 and collector 20 of transistor 60 which is further connected to a base 30 of an NPN transistor generally designated as 32 and having an emitter 34 and a collector 36. A resistor 38 is connected between junction point 28 and collector 36 of transistor 32 which is further connected to a positive power terminal 40. A Zener diode 42 is connected between ground 24 and junction point 28 such that the direction of easy current flow is toward junction point 28. A resistor 44 is connected between emitter 34 of transistor 32 and a junction point 45 which is further connected to an emitter 48 of an NPN transistor generally designated as 49 having a base 50 and a collector 52. A resistor 54 is connected between junction point 45 and ground 24. A resistor 56 is connected between junction point 28 and collector 52 which is further connected to a base 58 of an NPN transistor generally designated as 60 having a collector 62 and an emitter 64. Collector 62 is connected to positive terminal 40 while emitter 64 is connected to an output terminal 66. A resistor 68 is connected between output terminal 66 and a junction point 70. A resistor 72 is connected between junction point 70 and ground 24. A feedback resistor 74 is connected between junction point 70 and a junction point 76 which is further connected to base 50 of transistor 48. A capacitor 78 is connected between junction point 76 and an emitter 80 of a PNP transistor generally designated as 82 having a base 84 and a collector 86. A resistor 88 is connected between base 84 and a switching signal input terminal 90. Collector 86 is connected to ground 24 and also to a collector 92 of a PNP transistor generally designated as 94 having a base 96 and an emitter 98. A second capacitive means 100 is connected between emitter 98 and a junction point 76 which is further connected to base 18 of transistor 16. A resistor 102 is connected between base 96 and a second switching signal input terminal 104. The input terminals 90 and 104 have signals applied thereto which are 180° out of phase as shown by the reference signal symbols adjacent thereto. The components from 78 to 104 are included in a dashed line box generally designated as 106 and constitute an addition to the more basic amplifying circuit. A dashed line box 108 contains a resistor 110 which is connected between input 12 and junction point 76. Resistor 110 constitutes a second addition to the circuit. With the contents of 106 and 108 removed the remaining circuitry acts as an ordinary amplifier. With the addition of the components of box 106 the circuit will act as a lead network and with the addition of the resistor 110 in box 108 in addition to the circuitry of 106, the circuit will act as a high-pass filter.

In FIGURE 2 a resistor 125 is connected between an input 127 and an emitter 129 of an NPN transistor generally designated as 131 having a base 133 and a collector 135. A resistor 137 is connected between a positive power terminal 139 and collector 135 which is further connected to a base 141 of an NPN transistor generally designated as 143 having a collector 145 and an emitter 147. Collector 145 is connected to positive power terminal 139 while emitter 147 is connected to an output terminal 149. A resistor 151 is connected between output 149 and a junction point 153. A resistor 155 is connected between junction 153 and ground potential 157. A resistor 159 is connected between junction point 153 and base 133 of transistor 131. Resistor 159 acts as a feedback resistor. A variable impedance means or potentiometer 161 has a resistance element 163 connected between base 133 and one lead of a capacitor 165 which has the other lead connected to ground 157. A variable wiper 165 of potentiometer 161 is connected to base 133. A resistor 167 is connected between emitter 129 and ground 157.

In discussing the operation of FIGURE 1 it should be realized that Zener diode 42 is required only when the power applied to terminal 40 is somewhat unstable in amplitude. The Zener diode 42 is useful in stabilizing the power applied to the collectors of transistors 16 and 49 and the bases of transistors 32 and 60 for biasing purposes. When an input signal of a given polarity direction change is applied to terminal 12, each stage will follow along with the change. Thus the signal appearing at terminal 66 will be the same polarity change as the signal applied at terminal 12. This signal is voltage divided and applied through a feedback resistor 74 to the feedback terminals or bases of the common base connected transistors to provide both AC and DC negative feedback. The direct current feedback is utilized to provide voltage or operational stability while the AC feedback affects the AC voltage gain from input to output.

With the components of boxes 106 and 108 removed, the remaining circuitry will result in a highly stable high-gain amplifier. The magnitude of resistor 74 and the respective magnitudes or resistances of resistors 68 and 72 a voltage dividing network will determine the gain of the amplifier. If the unit 106 is connected as shown, capacitor 78 and 100 will alternately and successively be switched into the circuit between junction point 76 and ground 24. It may be assumed that these two capacitors are initially in an uncharged condition. This will result in the base 18 being connected directly to ground. The feedback signal will thus be used to charge the two capacitors and initially will apply little or no feedback signal to the feedback terminals of the various stages. As the capacitors 78 and 100 charge, the feedback signal will become larger on each successive operation of the switches 82 and 94. It will thus be ascertained that with a given amplitude input signal at terminal 12, the output at terminal 66 will initially be of a high amplitude and then will become less as more feedback is applied to the various feedback terminals. This is due to the well known operation of negative feedback. After a time the capacitors 78 and 100 will be charged to nearly the full amplitude of the signal appearing at junction point 70 and the gain will then remain constant through the amplifier and accordingly the output signal at terminal 66 will remain constant with respect to the input at termianl 12. It will be realized however that the signal at junction point 76 can never equal the input signal since this would eliminate any signal through the amplifier and accordingly the output will drop until equilibrium is reached. If the amplitude of the input signal now changes either in an increasing or a decreasing manner, the output will change immediately, and for a rapid change in input the output will change a greater abount than for a slow or gradual change. This operation results in what is called a "lead" network.

If resistor 110 is now added, it will be found that the capacitors 78 and 100 can charge even further toward the amplitude of the input signal and eventually reach the input signal amplitude. This will result in a signal being applied to the feedback terminals of the amplifier of exactly the same amplitude as the input signal and therefore there will be no signal appearing at the output terminal 66 since the signal at base 18 will equal the amplitude of the signal appearing at emitter 14 and thus transistor 16 will cease to operate. This configuration of circuitry is known as a high-pass filter since the changes in frequency are applied to output terminal 66 but the amplitude of the signal at this point quickly degenerates to zero and no further output is obtained until the input again changes amplitude. While the input signal will normally be the same frequency as the switching signal this condition is not necessary and may be different for some applications of the circuit. Although the circuitry is shown with two stages of amplification, it will be realized that one stage will operate just as well for some applications of the idea. Further, more stages will operate similarly and may be usable in some instances.

The operation of the amplifier shown in FIGURE 2 is self-explanatory to a great extent and only a cursory explanation will be needed. An input signal is applied to terminal 127, the same phase signal will appear at collector 135 and at output 149. This signal will be fed back in a negative feedback manner through resistor 159 to base 133. If resistor 161 and capacitor 165 were removed, the amplifier would be a constant gain unit. However, it is often desirable to have a variable gain amplifier wherein the total voltage swing at the output remains constant or in other words where the maximum swing is constant while the gain is varied. This is accomplished by placing the capacitor 165 in series with the variable potentiometer 161 to change the amount of AC signal which is diverted to reference potential 157. As the feedback signal applied to 131 is diverted to ground 157 through capacitor 165, the feedback becomes less and the gain of the unit becomes greater. As will be realized, a variable biased transistor could be used in the place of resistor 161 and essentially this is what is done in FIGURE 1 except that a switching signal is applied to terminal 104 instead of a variable amplitude direct voltage signal. Thus, FIGURE 2 merely illustrates a portion of FIGURE 1 in a different context.

While a few embodiments of the invention have been shown, it is to be realized that the description given is not limiting.

What is claimed is:

1. High-pass filter apparatus comprising, in combination:
  - input signal means;
  - first and second transistor means of a given polarity type and each including base means, emitter means and collector means;
  - reference potential means;
  - means connecting said input means to said emitter means of said first transistor means;
  - power supply means connected to said collector means of said second transistor means;
  - means connecting said collector means of said first transistor means and said base means of said second transistor means together and to said power supply means;
  - output means;
  - means connecting said emitter means of said second transistor means to said output means for supplying a signal thereto;
  - feedback means connected between said output means and said base means of said first transistors means;
  - impedance means connected between said input means and said base means of said first transistor means;
  - first and second capacitive means each having one lead connected to said base means of said first transistor means; and
  - transistor switching means connected between the other lead of each capacitive means and said reference potential means for alternately connecting each of said first and second capacictive means to said reference potential means.

2. Lead network apparatus comprising, in combination:
  - input signal means;
  - first and second transistor means of a given polarity type and each including base means, emitter means and collector means;
  - reference potential means;
  - means connecting said input means to said emitter means of said first transistor means;
  - power supply means connected to said collector means of said second transistor means;
  - means connecting said collector means of said first transistor means and said base means of said second transistor means together and to said power supply means;
  - output means;
  - means connecting said emitter means of said second transistor means to said output means for supplying a signal thereto;
  - feedback means connected between said output means and said base means of said first transistor means;
  - first and second capacitive means each having one lead connected to said base means of said first transistor means; and
  - transistor switching means connected between the other lead of each capacitive means and said reference potential means for alternately connecting each of said first and second capacitive means to said reference potential means.

3. Variable amplifier apparatus comprising, in combination:
input signal means;
first and second transistor means of a given polarity type and each including base means, emitter means and collector means;
reference potential means;
means connecting said input means to said emitter means of said first transistor means;
power supply mean connected to said collector means of said transistor means;
means connecting said collector means of said first transistor means and said base means of said second transistor means together and to said power supply means;
output means;
means connecting said emitter means of said second transistor means to said output means for supplying a signal thereto;
feedback means connected between said output means and said base means of said first transistor means; and
variable impedance means connected between said reference potential means and said base means of said first transistor means.

4. High-pass filter apparatus comprising, in combination:
input signal means;
first and second amplifying means each including first means, second means and third means;
power supply means including first and second output means;
means connecting said input means to said second means of said first amplifying means;
means connecting said first output means of said power supply means to said third means of said second amplifying means;
means connecting said third means of said first amplifying means and said first means of said second amplifying means together and to said first output means of said power supply means;
apparatus output means;
means connecting said second means of said second amlifying means to said apparatus output means for supplying a signal thereto;
feedback means connected between said apparatus output means and said first means of said first amplifying means;
impedance means connected between said input means and said first means of said first amplifying means;
first and second capacitive means each having one lead connected to said first means of said first amplifying means; and
switching means connected between the other lead of each capacitive means and said second output means of said power supply means for alternately connecting each of said first and second capacitive means to said second output means of said power supply means.

5. Lead network apparatus comprising, in combination:
input signal means;
first and second amplifying means each including first means, second means and third means;
power supply means including first and second output means;
means connecting said input means to said second means of said first amplifying means;
means connecting said first output means of said power supply means connected to said third means of said second amplifying means;
means connecting said third means of said first amplifying means and said first means of said second amplifying means together and to said first output means of said power supply means;
apparatus output means;
means connecting said second means of said second amlifying means to said apparatus output means for supplying a signal thereto;
feedback means connected between said apparatus output means and said first means of said first amplifying means;
capacitive means having one lead connected to said first means of said first amplifying means; and
switching means connected between the other lead said capacitive means and said second output means of said power supply means for alternately connecting and disconnecting said capacitive means in circuit with said second output means of said power supply means.

6. High-pass filter means comprising, in combination:
feedback stabilized amplifier means including input means, output means and feedback means;
reference potential means;
first capacitive means and first switching means connected in series between said feedback means and said reference potential means;
second capacitive means and second switching means connected in series between said feedback means and said reference potential means;
means connected to said first and second switching means for alternately connecting said first and then said second capacitive means between said feedback means and said reference potential means, said capacitive means increasing the magnitude of any feedback signals applied to said feedback means with time; and
impedance means connected between said input means and said feedback means for charging said capacitive means to the potential of any signal applied to said input means over a period of time.

7. High-pass filter means comprising, in combination:
feedback stabilized amplifier means including input means, output means and feedback means;
reference potential means;
capacitive means and switching means connected in series between said feedback means and said reference optential means;
means connected to said switching means for alternately connecting and disconnecting said capacitive means circuit between said feedback means and said reference potential means, said capacitive means increasing the magnitude of any feedback signals applied to said feedback means with time; and
impedance means connected between said input means and said feedback means for charging said capacitive means to the potential of any signal applied to said input means over a period of time.

References Cited

UNITED STATES PATENTS

| | | | |
|---|---|---|---|
| 2,764,643 | 9/1956 | Sulzer | 330—28 X |
| 2,912,654 | 11/1959 | Hansen | 331—117 |
| 2,955,259 | 10/1960 | Lax | 330—29 X |
| 2,981,892 | 4/1961 | Franks et al. | 330—107 X |
| 2,986,707 | 5/1961 | Blecher | 330—86 |
| 3,121,199 | 2/1964 | Harrison | 330—107 X |
| 3,223,936 | 12/1965 | McDonald | 330—86 X |

ROY LAKE, Primary Examiner

JAMES B. MULLINS, Assistant Examiner

U.S. Cl. X.R.

330—28, 29, 107, 109, 110